US006054378A

United States Patent [19]
Skala et al.

[11] Patent Number: 6,054,378
[45] Date of Patent: Apr. 25, 2000

[54] METHOD FOR ENCAPSULATING A METAL VIA IN DAMASCENE

[75] Inventors: Stephen L. Skala, Fremont; Subhas Bothra, San Jose, both of Calif.

[73] Assignee: VLSI Technology, Inc., San Jose, Calif.

[21] Appl. No.: 09/104,753

[22] Filed: Jun. 25, 1998

[51] Int. Cl.$^7$ .............................................. H01L 21/4763
[52] U.S. Cl. .................... 438/620; 438/622; 438/624; 438/626; 438/627; 438/629; 438/631; 438/643; 438/645; 438/648; 438/653; 438/656; 438/666
[58] Field of Search ................................. 438/620, 622, 438/624, 626, 627, 629, 631, 643, 645, 648, 653, 656, 666

[56] References Cited

U.S. PATENT DOCUMENTS

| | | | |
|---|---|---|---|
| 5,229,325 | 7/1993 | Park et al. | 437/187 |
| 5,571,740 | 11/1996 | Peterson | 437/51 |
| 5,658,830 | 8/1997 | Jeng | 438/620 |
| 5,910,020 | 6/1999 | Yamada | 438/624 |

Primary Examiner—John F. Niebling
Assistant Examiner—David A. Zarneke
Attorney, Agent, or Firm—Martine Penilla & Kim, LLP

[57] ABSTRACT

Disclosed is a method for encapsulating a via over a first metal layer of a semiconductor substrate in a damascene processing to prevent voiding. The method includes forming an intermetal oxide (IMO) layer over the first metal layer and forming a via in the IMO layer such that the via exposes a portion of the first metal layer and a side wall of the via in the IMO layer. The method also includes conformally forming a first barrier layer over the IMO layer and the via such that a portion of the first barrier layer is deposited over the side wall of the IMO layer and the exposed portion of the first metal layer. The method further includes depositing a second metal layer over the first barrier layer such that the second metal layer fills the via within the first barrier layer portion deposited in the via to form a metal via. Additionally, the method includes removing the second metal layer and the first barrier layer above a top portion of the IMO layer and forming a trench in a portion of the IMO layer in contact with the first barrier layer to a specified depth. The method further includes forming a second barrier layer in the trench. The method also forming a third metal layer over the second barrier layer in the trench to form a metal trench such that the metal via is encapsulated by the first barrier layer so as to reduce electromigration effect in the metal via.

51 Claims, 6 Drawing Sheets

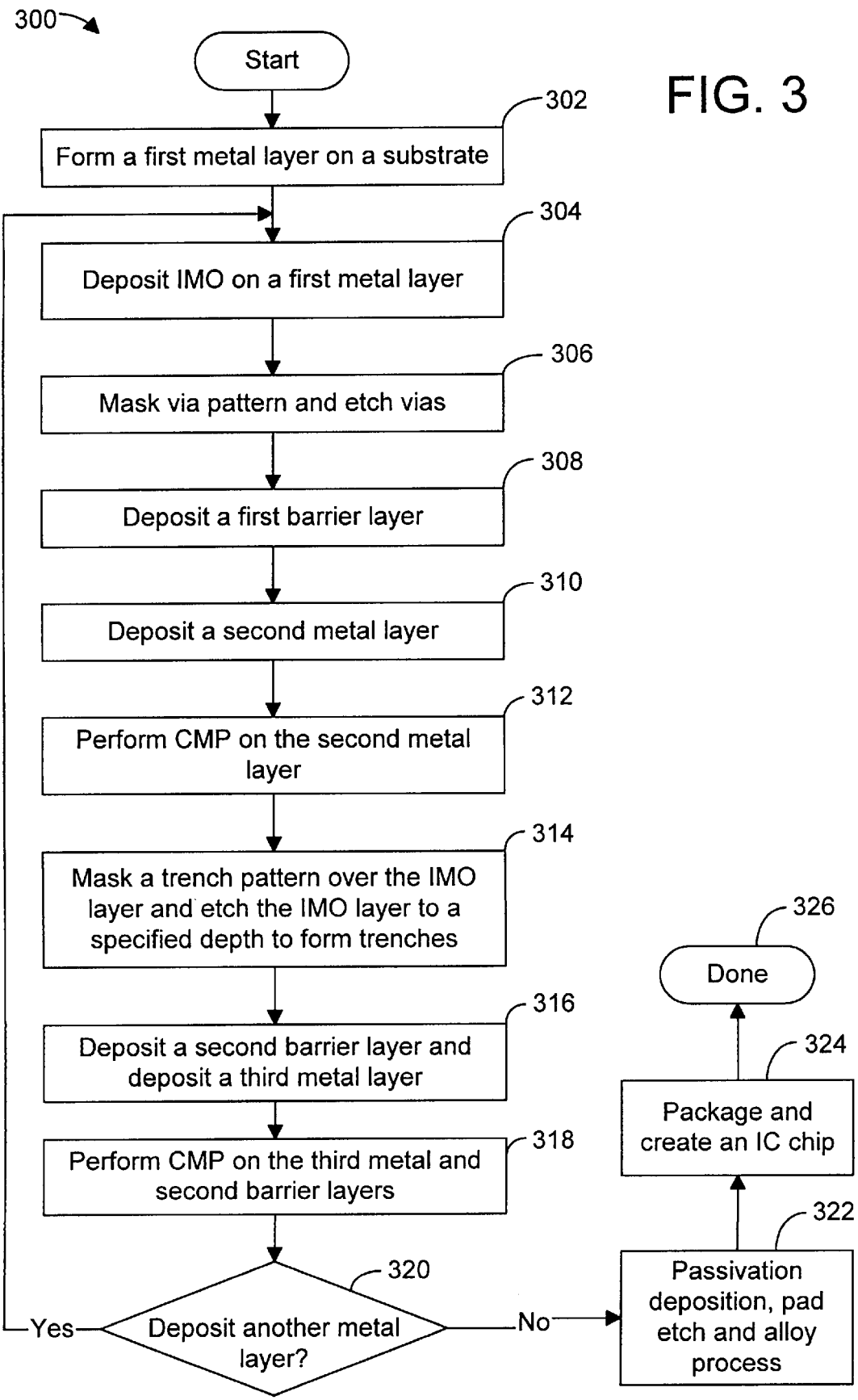

METHOD FOR ENCAPSULATING A METAL VIA IN DAMASCENE

BACKGROUND OF THE INVENTION

1. Field of the Invention

This invention relates generally to the manufacture of semiconductor devices, and more particularly to a method for encapsulating a metal via in a damascene process.

2. Description of the Related Art

Since the introduction of semiconductor devices, the size of semiconductor devices have been continuously shrinking, resulting in smaller semiconductor chip size and increased device density on the chip. One of the limiting factors in the continuing evolution toward the smaller device size and higher density has been the interconnect area needed to route interconnect lines between devices. As a way to overcome such a limitation, multilevel interconnection systems have been implemented using shared interconnect lines between two or more levels.

Originally, conventional process techniques implemented multilevel interconnection systems by depositing a metal layer, photomasking the deposited metal layer, and then etching the metal layer to form desired interconnections. However, since metals are typically more difficult to pattern and etch than other semiconductor layers such as dielectric or oxide layers, a dual damascene process has been implemented to form metal vias and interconnects by dispensing entirely with the metal etching process. Dual damascene process is a well known semiconductor fabrication method for forming metallization vias and interconnect lines.

In the dual damascene process, a via and a trench is etched in an oxide layer such as intermetal dielectric layer. The dielectric layer is typically formed over a metal layer. The via and the trench are then filled with a metal (e.g., Al, Cu) in the vias and trenches to form the metallization vias and interconnect lines, respectively. The excess metal above the trench level is then removed by well known chemical-mechanical polishing (CMP) processes.

Dual damascene process is gaining wider application in semiconductor process because it offers significant advantages over conventional process of etching metals. For example, it does not require etching of metals, such as copper and to a lesser degree, aluminum, which are more difficult to pattern and etch than dielectric materials. Additionally, the dual damascene process involves less process steps than conventional techniques that form vias as a separate step.

Unfortunately, the metal vias and trenches formed through the conventional dual damascene process typically suffer from adverse electromigration effects that often lead to device failure. By way of example, Prior Art FIG. 1 illustrates cross sectional view of a silicon wafer stack 100 formed using a conventional dual damascene process. The wafer stack 100 includes a substrate 102 and an oxide layer 104, a metallization layer 106, a barrier layer 110, an intermetal oxide (IMO) layer 108, and a pair of metal vias 118 and 120, and a metal interconnect line 112. The oxide layer 104 is formed over the substrate 102 and the metallization layer 106 is formed over the oxide layer 104. The barrier layer 110, the IMO layer 108, the metal interconnect line 112, and the metal vias 118 and 120 are formed over portions of the oxide layer 104 and the metallization layer 106 using conventional dual damascene process.

In this wafer stack configuration, when an electric potential is applied across the metallization layer 106, the electric potential causes an eletromigration effect in the metal interconnect 116 and the metal vias 118 and 120. Specifically, the electric potential causes one metallization portion to be a cathode and the other metallization portion to be an anode. The electric potential between the cathode and anode causes a current flow from the anode end to the cathode end through the metal interconnect 112 and metal vias 118 and 120.

Since the direction of electrons is opposite of the direction of current flow, the electrons migrate from the cathode end of the metal via 120 toward the anode end of the metal via 118. In this process, the moving electrons generate an "electron wind," which pushes or forces the metal atoms in the direction of the electrons from the metal via 120 near the cathode toward the metal via 118 near the anode. The barrier layer 110 prevents the electrons and atoms in the metal vias 118 and 120 from migrating to and from the metal layer 106 underneath. As a result, a void 114 forms near the cathode in the metal via 120 while atoms accumulate as a hillock 116 near the anode in the metal via 118. The void near the cathode in the metal via 120 often leads to device failure. Accordingly, voiding in a metal via undermines reliability of semiconductor devices produced by conventional dual damascene processes.

Furthermore, the voiding problem limits the current through the metal vias 118 and 120. This is because the size of the void increases as the current density through the metal vias 118 and 120 increases. Hence, to avoid voiding that may lead to an open circuit, the metal vias 118 and 120 may not be able to conduct a high current density.

In view of the foregoing, what is needed is a method for preventing voids in a metal via to ensure fabrication of more reliable semiconductor devices. In addition, what is needed is a method for reducing an electromigration effect through metal vias and trenches produced by a dual damascene process. What is also needed is a method of forming a metal via capable of conducting higher current densities.

SUMMARY OF THE INVENTION

Broadly speaking, the present invention fills these needs by providing a method for encapsulating a metal via in a dual damascene process to prevent voiding. It should be appreciated that the present invention can be implemented in numerous ways, including as a process, an apparatus, a system, a device, or a method. Several inventive embodiments of the present invention are described below.

In one embodiment, the present invention provides a method for encapsulating a via over a first metal layer of a semiconductor substrate in a damascene processing to prevent voiding. The method includes forming an intermetal oxide (IMO) layer over the first metal layer and forming a via in the IMO layer such that the via exposes a portion of the first metal layer and a side wall of the via in the IMO layer. The method also includes conformally forming a first barrier layer over the IMO layer and the via such that a portion of the first barrier layer is deposited over the side wall of the IMO layer and the exposed portion of the first metal layer. The method further includes depositing a second metal layer over the first barrier layer such that the second metal layer fills the via within the first barrier layer portion deposited in the via to form a metal via. Additionally, the method includes removing the second metal layer and the first barrier layer above the metal via and forming a trench in a portion of the IMO layer in contact with the first barrier layer to a specified depth. The method further includes forming a second barrier layer in the trench. The method also forming a third metal layer over the second barrier layer in the trench to form a metal trench such that the metal via is encapsulated by the first barrier layer so as to reduce electromigration effect in the metal via.

In another embodiment, the present invention provides a method for encapsulating a via over a first metal layer of a semiconductor substrate in a damascene processing to prevent voiding. The method includes (a) depositing an intermetal oxide (IMO) layer over the first metal layer; (b) forming a via in the IMO layer such that the via exposes a portion of the first metal layer and a side wall of the via in the IMO layer; (c) forming a first barrier layer in the via over the side wall of the IMO layer and the exposed portion of the first metal layer; (d) forming a metal via by depositing a second metal layer in the via to fill the via; (e) forming a trench of a specified depth in a portion of the IMO layer that is adjacent to the first barrier layer formed in the via; and (e) forming a second barrier layer in the trench; and (f) forming a third metal layer over the second barrier layer in the trench to form a metal trench.

In yet another embodiment, the present invention provides a method for encapsulating a via formed in an intermetal oxide (IMO) layer in a damascene processing to prevent voiding. The IMO layer is formed over a first metal layer of a semiconductor substrate. The via is defined by an exposed portion of the first metal layer and a side wall of the IMO layer. The method includes forming a first barrier layer in the via over the side wall of the IMO layer and the exposed portion of the first metal layer. The method also includes forming a metal via by depositing a second metal layer in the via so as to fill the via. The method further includes forming a trench of a specified depth in a portion of the IMO layer that is adjacent to the first barrier layer formed in the via. Additionally, the method includes forming a second barrier layer in the trench. The method also includes forming a third metal layer over the second barrier layer in the trench to form a metal line such that the metal via is encapsulated by the first barrier layer apart from the metal line so as to reduce electromigration effect in the metal via.

Advantageously, the encapsulated metal via effectively reduces voiding in the metal via by preventing the electromigration of electrons and atoms from the metal via to a metal line. The barrier layers that encapsulate metal via create stress gradients between the metal via and the metal line (e.g., metal trench) so that electromigration effect is significantly reduced for a small metal segment such as the metal via. In addition, the encapsulation allows higher current densities through the metal via than conventional metal vias. Accordingly, the encapsulation of the metal vias enhance the metal vias' reliability and prolong the semiconductor device lifetime. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

FIG. 3 illustrates a flow diagram of a method for encapsulating a metal via in a dual damascene process to prevent voiding in accordance with one embodiment of the present invention.

DETAILED DESCRIPTION OF THE PREFERRED EMBODIMENTS

An invention is described for a method for encapsulating a metal via in a dual damascene process to prevent voiding. It will be obvious, however, to one skilled in the art, that the present invention may be practiced without some or all of these specific details. In other instances, well known process operations have not been described in detail in order not to unnecessarily obscure the present invention.

The present invention encapsulates a metal via in a dual damascene process to prevent voiding in the metal via. The encapsulated metal via effectively reduces electromigration effect to prolong metal via's reliability and electromigration lifetime. In addition, the encapsulated metal via allows higher current densities in the metal via than conventional metal vias.

Figure 1:
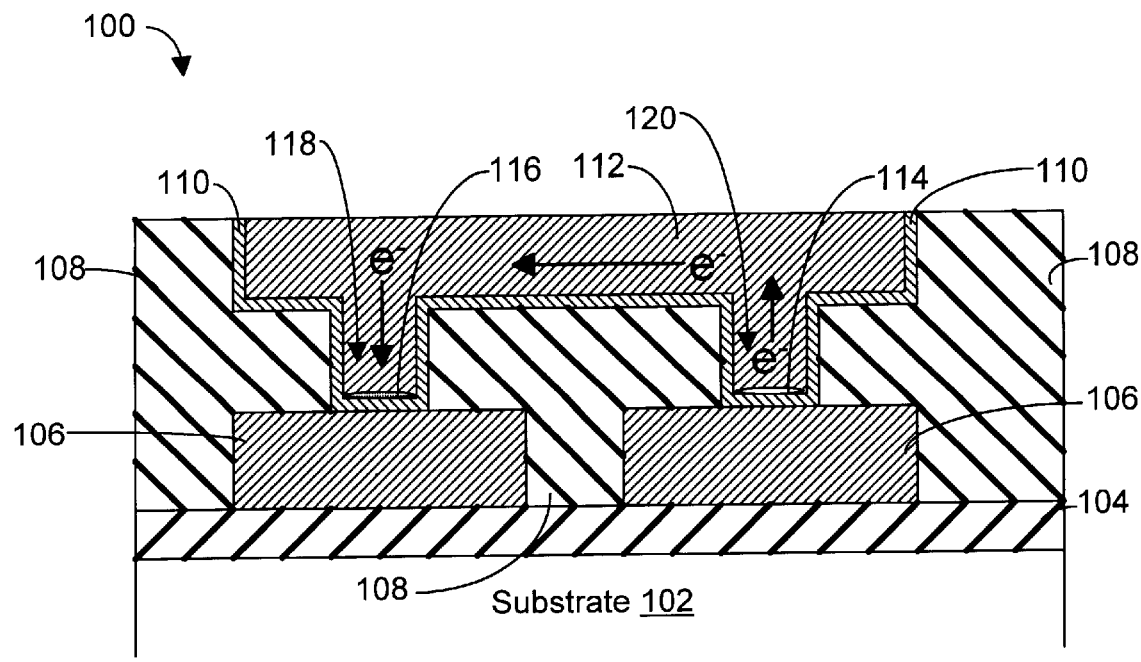
FIG. 1 illustrates cross sectional view of a silicon wafer stack formed using conventional dual damascene process for depicting electromigration effect.
Figure 2A:
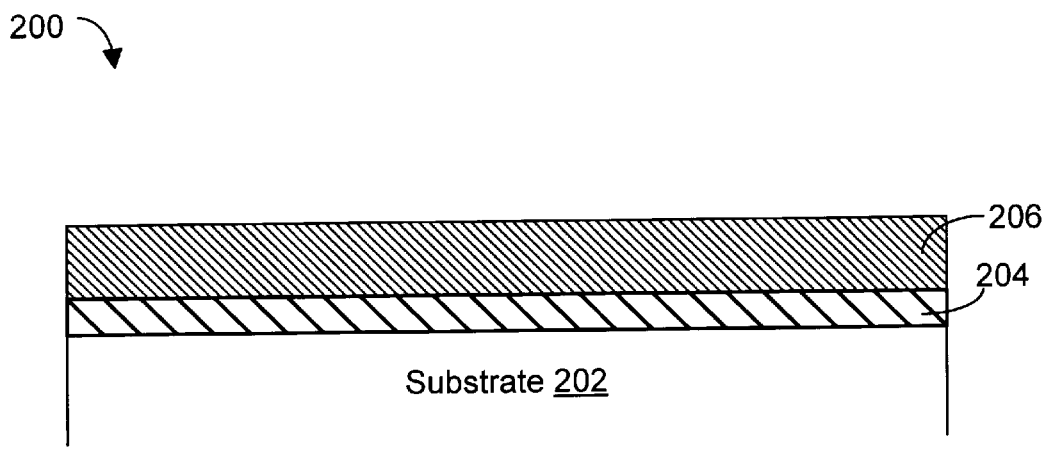
FIG. 2A illustrates a cross sectional view of a partially fabricated silicon wafer stack that includes a metallization layer in accordance with one embodiment of the present invention.

FIG. 2A illustrates a cross sectional view of a partially fabricated silicon wafer stack 200 that includes a metallization layer 206 in accordance with one embodiment of the present invention. The wafer stack 200 includes a substrate 202, an oxide layer 204, and the metallization layer 206. The oxide layer 204 is disposed over the substrate 202. The oxide layer 204 may be an IMO layer.

The metallization layer 206 is formed over the oxide layer 204. The metallization layer 206 can be deposited using any suitable deposition processes such as chemical vapor deposition (CVD), plasma enhanced CVD (PECVD), physical vapor deposition (PVD), and sputter deposition processes. The metallization layer 206 is preferably of about 0.65 micron thickness and ranges between 0.4 to 1 micron thickness. Although such metallization thickness is described herein, those skilled in the art will readily appreciate that the present invention may be implemented with a metallization layer of various thickness.

In accordance with one embodiment of the present invention, the metallization layer 206 may include aluminum (Al), copper (Cu), or any of the known aluminum alloys such as Al—Cu, Al—Si, or Al—Cu—Si. It should be appreciated that other additional layers above, below or between the layers shown may be present in the wafer stack 200. For example, a barrier layer typically formed of Ti, TiW, TiN or other suitable barrier materials may be disposed between the oxide layer 204 and the metallization layer 206. Not all the layers shown need be present and some or all may be substituted by other different layers.

Figure 2B:
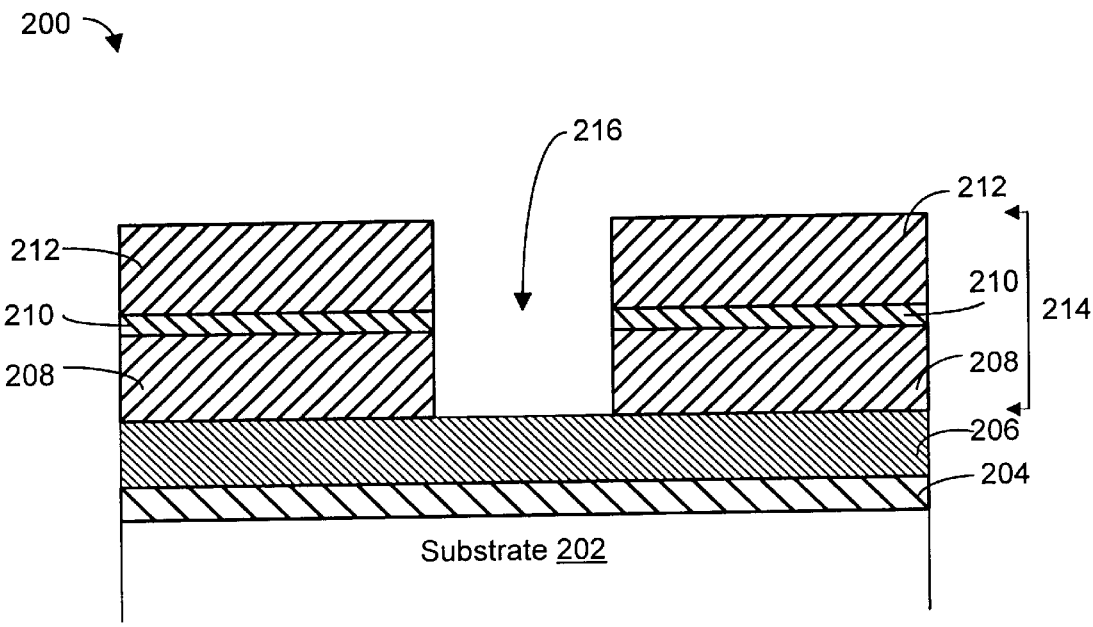
FIG. 2B shows a cross sectional view of the wafer stack after forming an intermetal oxide layer having a via.

FIG. 2B shows a cross sectional view of the wafer stack 200 after forming an IMO layer 214 having a via 216. To form the IMO layer 214 with the via 216, the IMO layer 214 is first deposited over the metallization layer 206 and etched to form the via 216. The IMO layer 214 is deposited by a CVD process, preferably a PECVD or a high density plasma CVD process. For example, the IMO layer 214 may be deposited by using CVD equipment such as Ultima Centura™ manufactured by Applied Materials, Inc. of Santa Clara, Calif.

After depositing the IMO layer 214, a photoresist layer is spin-coated and patterned over the IMO layer 214 to form a photomask through exposure and development using, for example, deep ultra-violet (UV) light. The photomask serves to define the etching location or portion over the IMO layer 214. The IMO layer 214 is then etched at least partially through until a portion of the metallization layer 206 is exposed to form the via 216. The via formed is preferably about 0.35 micron in diameter and may range between 0.25 to 0.5 microns. Although any suitable etching apparatus may be used, the present invention utilizes a plasma etching apparatus such as a Lam 4520XL™, manufactured by Lam Research of Fremont, Calif. In addition, even though the preferred embodiment uses such via sizes, it should be appreciated that the present invention may utilize any via size suitable in forming a metal via.

In accordance with one embodiment of the present invention, the IMO layer 214 includes a sandwich of IMO layers 208, 210, and 212. Using a CVD process, each of the IMO layers 208, 210, and 212 may be deposited one after another and then etched to form the via 216. Preferably, the IMO layers 208 and 212 are $SiO_2$ layers while the IMO layer 210 is a SiN layer, which functions as an etch stop layer. The IMO layers 208 and 210 are each approximately 0.65 microns thick, and may range from 0.4 to 1 micron in thickness. The IMO layer 210 is about 700 angstroms and may range between 400 to 1,000 angstroms. Although the IMO layer 214 uses $SiO_2$ and SiN layers with such thickness, it may also employ other suitable oxide layers having various thickness suitable as an IMO layer.

Figure 2C:
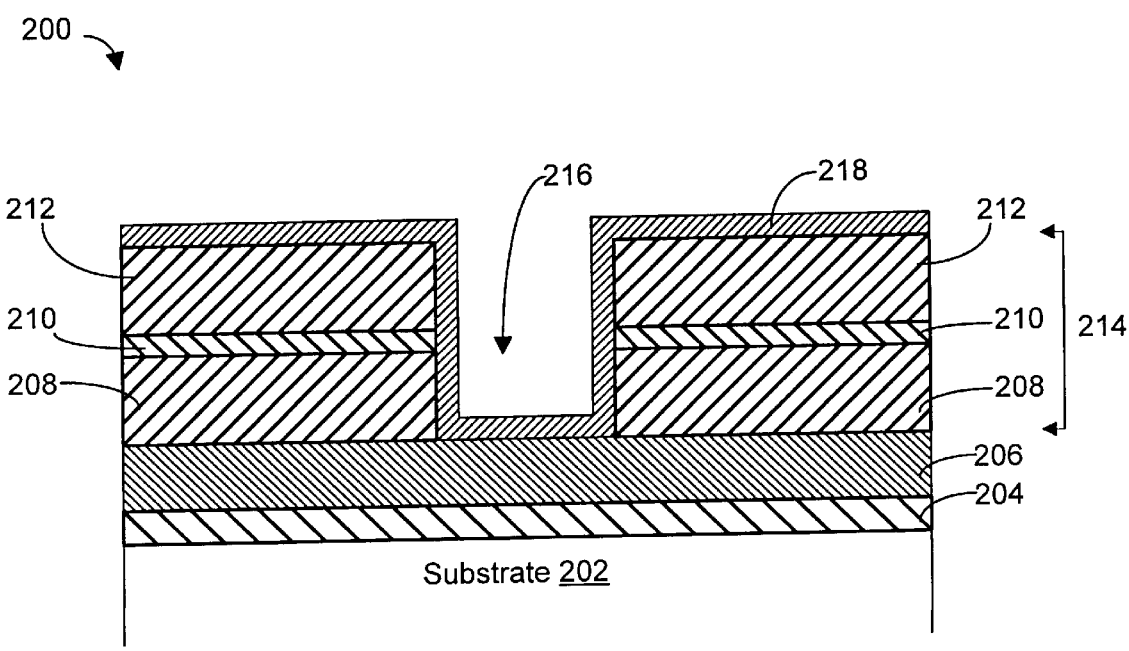
FIG. 2C illustrates a cross sectional view of the wafer stack having a barrier layer in accordance with one embodiment of the present invention.

FIG. 2C illustrates a cross sectional view of the wafer stack 200 having a barrier layer 218 in accordance with one embodiment of the present invention. The barrier layer 218 may include one or more metals such as TiN, Ta (tantalum), TaN, TiW, TaSiN, and WN. The barrier layer 218 serves to prevent adverse effects (e.g., pitting, spiking, diffusion, etc.) from a contact between an oxide layer (e.g., IMO layer 214) and a metal layer.

The barrier layer is deposited, preferably in a conformal manner, over the IMO layer 214 and the via 216 such that the barrier layer 218 is formed over the IMO layer 214 side walls and the metallization layer 206 in the via 216. In general, the barrier layer 218 may be deposited by a sputter deposition or CVD process. However, for a barrier layer such as TiN layer, the present invention uses an ionized metal plasma PVD process using a PVD apparatus such as Endura System™ from Applied Materials, Inc. of Santa Clara, Calif.

Figure 2D:
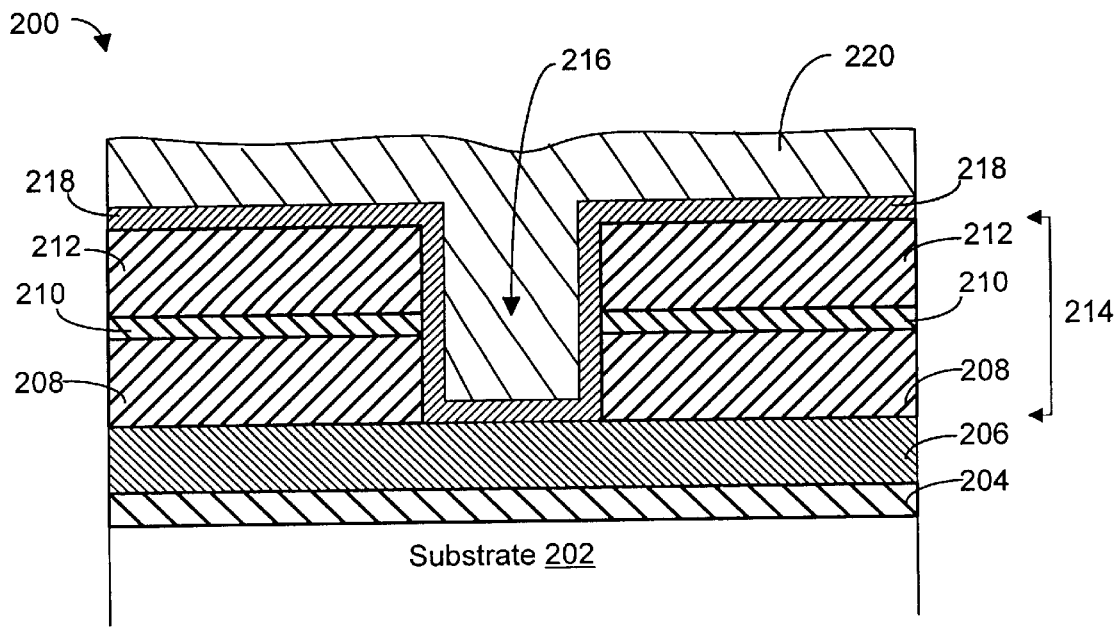
FIG. 2D shows a cross sectional view of the wafer stack after depositing a metal layer over the barrier layer.

FIG. 2D shows a cross sectional view of the wafer stack 200 after depositing a metal layer 220 over the barrier layer 218. The metal layer 220 is deposited over the barrier layer 218 so that the via 216 is filled with the metal layer 220, preferably entirely. In accordance with one embodiment of the present invention, the metal layer 220 may include Al, Cu, or any of the known aluminum alloys such as Al—Cu, Al—Si, or Al—Cu—Si. For Cu, the preferred deposition method is electrochemical deposition using deposition equipment such as LT210™ from Semitool Inc. of Kalispell, Mont. The preferred deposition method for Al is sputter deposition or CVD process. Although such deposition processes are used, it should be appreciated that the metal layer 220 may be deposited using any suitable deposition processes such as CVD, PECVD, PVD, and sputter deposition processes.

Figure 2E:
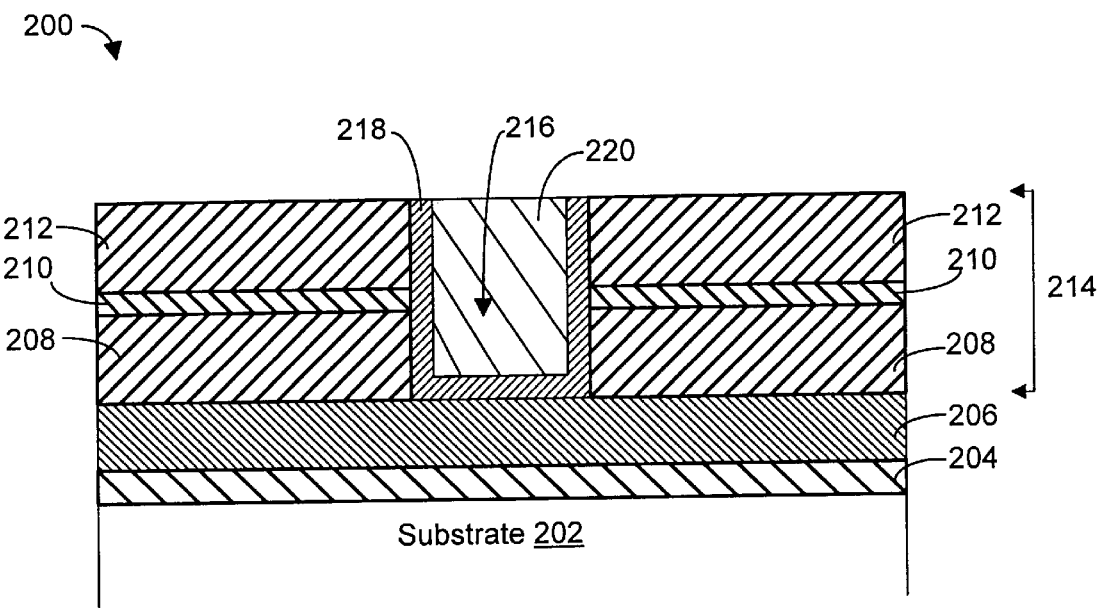
FIG. 2E illustrates a cross sectional view of the wafer stack including the filled metal via.

FIG. 2E illustrates a cross sectional view of the wafer stack 200 including the filled metal via 216. The metal layer 220 and the barrier layer 218 above the top of the IMO layer 214 (i.e., top of the metal via 216) have been removed by a chemicalmechanical polishing (CMP) process. The CMP of the metal layer 220 and the barrier layer 218 leaves the metal via 216 encapsulated in the remaining barrier layer 218 previously formed within the via 216. The CMP of the metal layer 220 and the barrier layer 218 may be carried out in a CMP system such as Strausbaugh 6CA Polisher™ from Strausbaugh Inc. of San Luis Obispo, Calif.

Figure 2F:
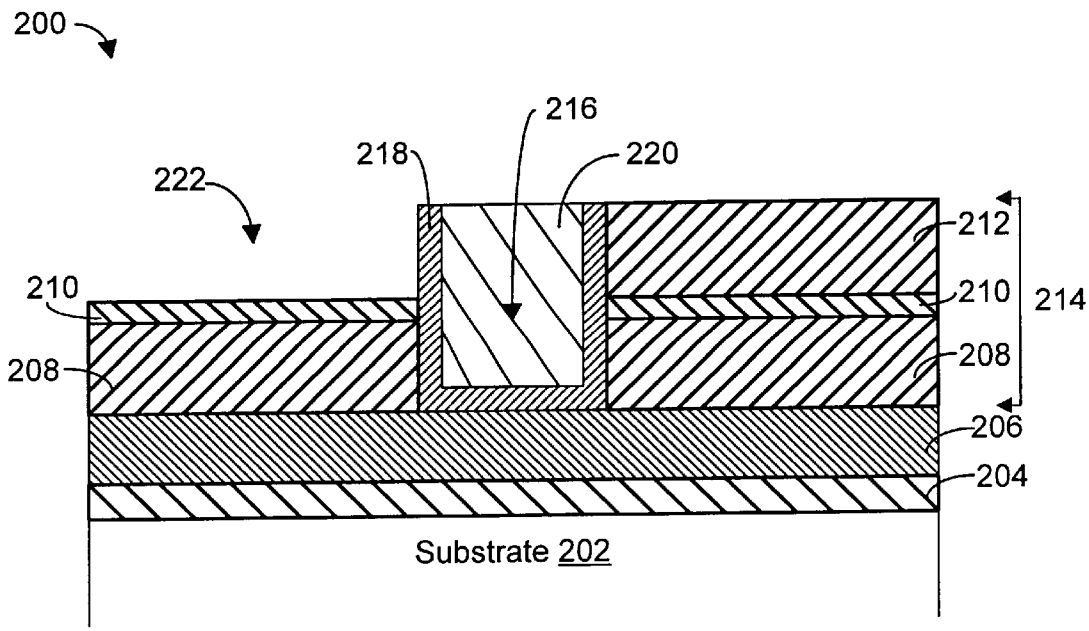
FIG. 2F shows a cross sectional view of the wafer stack including a trench.

FIG. 2F shows a cross sectional view of the wafer stack 200 including a trench 222. After removing the metal and barrier layers 220 and 218 over the IMO layer 214, the IMO layer 214 is photomasked and etched to form the trench 222. Specifically, a photoresist layer is spin-coated and patterned over the IMO layer 214 to form a photomask through exposure and development using, for example, deep UV light. The photomask serves to define the trench location or portion in the IMO layer 214 to be etched. The photomask is arranged so that the trench location or portion to be etched in the IMO layer 214 is adjacent to the barrier layer 220 around the metal via 216.

The IMO layer 214 is then etched to a desired depth to form the trench 222. The trench 222 is adjacent to the barrier layer 220. In one embodiment where the IMO layer includes three oxide layers 208, 210, and 212, a portion of the oxide layer 212 is etched to form the trench. Although any suitable etching apparatus may be used, the present invention utilizes a plasma etching apparatus such as a Lam 4520XL™, manufactured by Lam Research of Fremont, Calif.

Figure 2G:
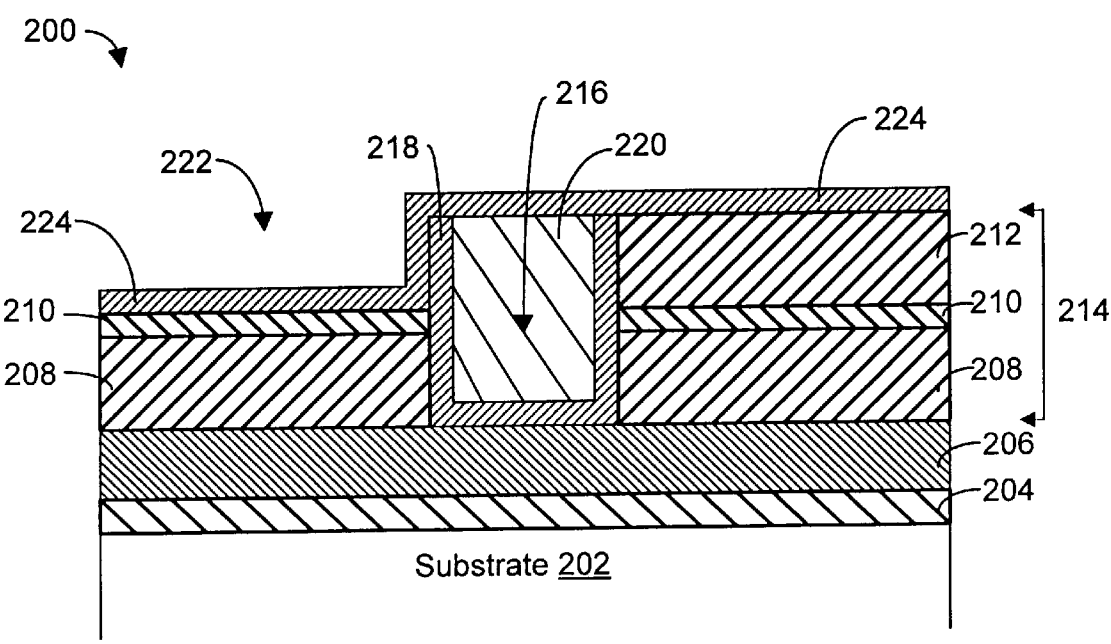
FIG. 2G illustrates a cross sectional view of the wafer stack including a barrier layer in accordance with one embodiment of the present invention.

FIG. 2G illustrates a cross sectional view of the wafer stack 200 including a barrier layer 224 in accordance with one embodiment of the present invention. The barrier layer 224 is deposited, preferably in a conformal manner, over remaining IMO layer 214 and the metal via 216. In one embodiment where the IMO layer 214 includes three IMO layers 208, 210, and 212, the barrier layer 224 is deposited over the exposed IMO layer 210 in the trench 222, the unetched IMO layer 212, and the metal via 216. After the deposition of the barrier layer 224, the metal via 216 is completely encapsulated by the barrier layers 218 and 224.

The barrier layer 224 may include one or more metals such as TiN, Ta, TaN, TiW, TaSiN, or WN. The barrier layer 224 serves to prevent adverse effects (e.g., pitting, spiking, diffusion, etc.) from a contact between an oxide layer (e.g., IMO layer 214) and a metal layer. The barrier layer 218 may be deposited by a sputter deposition or CVD process. However, for a barrier layer such as TiN layer, the present invention uses an ionized metal plasma PVD process using a PVD apparatus such as Endura System™ from Applied Materials, Inc. of Santa Clara, Calif.

Figure 2H:
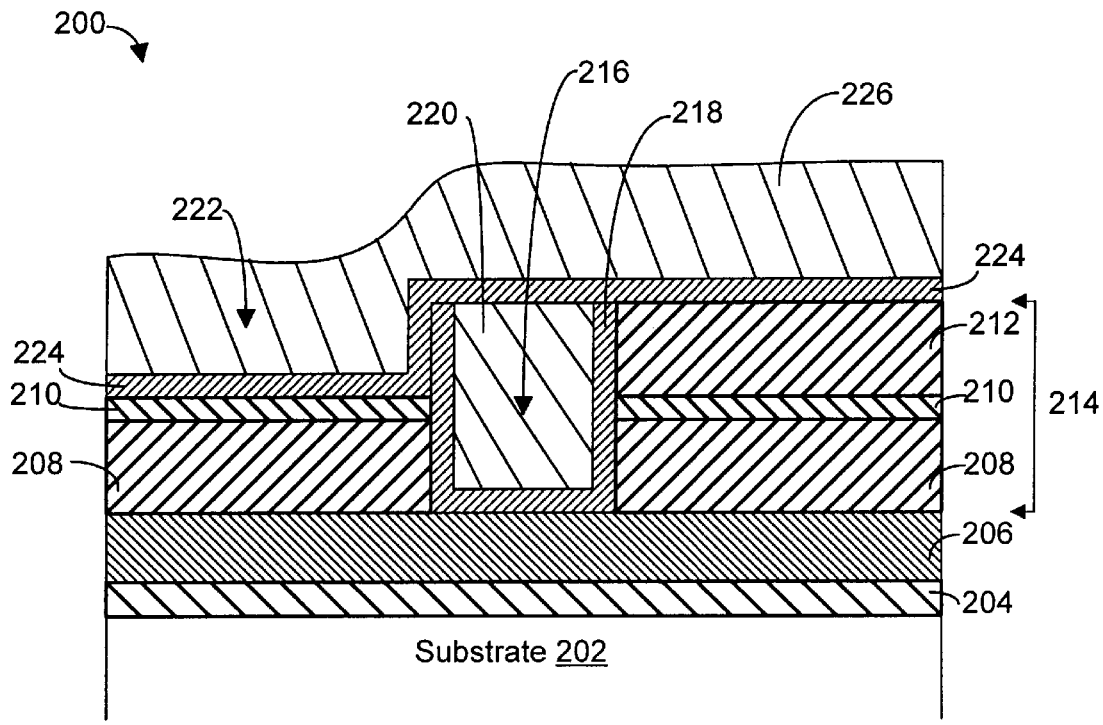
FIG. 2H shows a cross section of the wafer stack including a metal layer.

FIG. 2H shows a cross section of the wafer stack 200 including a metal layer 226. The metal layer 226 is deposited over the barrier layer 224 so that the trench 222 is filled, preferably entirely, with the metal layer 226. In accordance with one embodiment of the present invention, the metal layer 220 may include Al, Cu, or any of the known aluminum alloys such as Al—Cu, Al—Si, or Al—Cu—Si. For Cu, the preferred deposition method is electrochemical deposition using deposition equipment such as LT210™ from Semitool Inc. of Kalispell, Mont. The preferred deposition method for Al is sputter deposition or CVD process. Although such deposition processes are used, it should be appreciated that the metal layer 220 may be deposited using any suitable deposition processes such as CVD, PECVD, PVD, and sputter deposition processes.

Figure 2I:
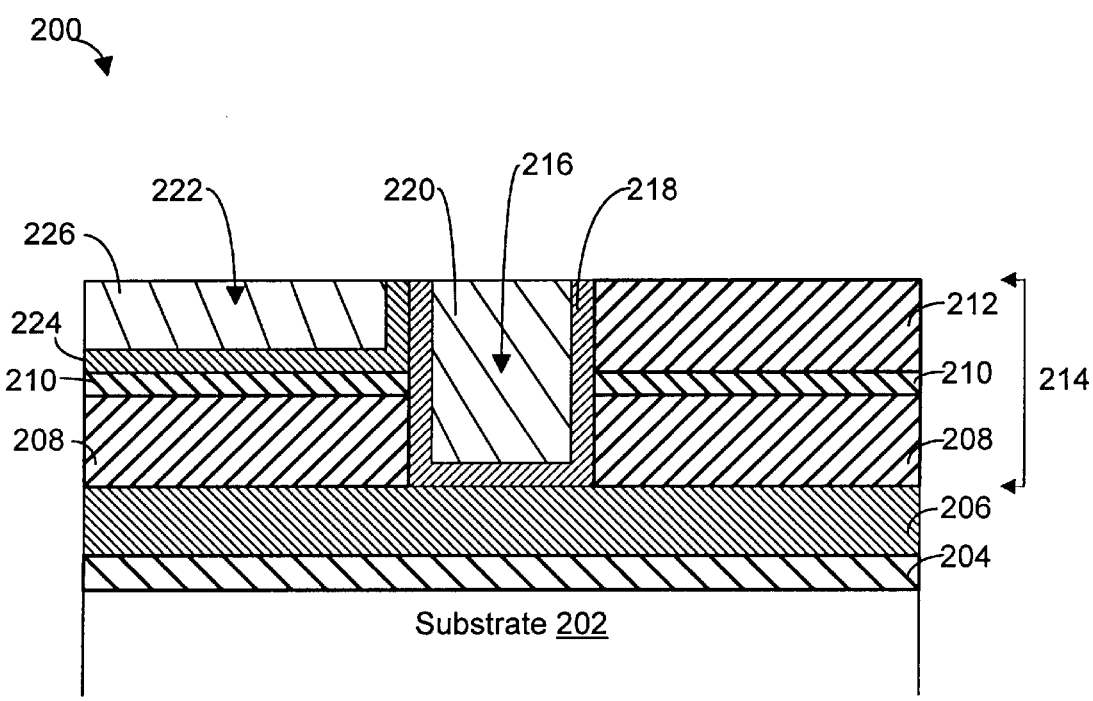
FIG. 2I illustrates a cross sectional view of the wafer stack including a metal trench and an encapsulated metal via in accordance with one embodiment of the present invention.

FIG. 2I illustrates a cross sectional view of the wafer stack 200 including the filled metal trench 222 and encapsulated metal via 216 in accordance with one embodiment of the present invention. The metal layer 226 and the barrier layer 224 above the top level of the IMO layer 214 (i.e., top of the metal trench 222) has been removed by a CMP process. The CMP of the metal layer 226 and the barrier layer 224 above the trench 222 results in the formation of the metal trench 222 that serves as an interconnect to the metallization layer 206. The CMP of the metal layer 220 and the barrier layer 218 may be carried out in a CMP system such as Strausbaugh 6CA Polisher™ from Strausbaugh Inc. of San Luis Obispo, Calif.

With continuing reference to FIG. 2I, the encapsulation of the metal via 216 by the barrier layers 218 and 224 apart from the metal trench 222 significantly reduces electromigration effect and voiding in the metal via 216. For small segments of metal such as the metal via 216, the electromigration effect is dramatically reduced due to the stress gradient between the metal via and the barrier layers 218 and 224. In particular, the encapsulating barrier layers 218 and 224 reduces electromigration effect by inducing sufficient back stress to compensate for the electromigration effect. Accordingly, the encapsulated metal via 216 enhances device reliability.

FIG. 3 illustrates a flow diagram of a method 300 for encapsulating a metal via in a dual damascene process to prevent voiding in accordance with one embodiment of the present invention. In operation 302, the method 300 forms a first metal layer on a semiconductor substrate or an oxide layer formed on the substrate. The metallization layer preferably includes Al or Cu. The first metal layer may be deposited through any suitable deposition processes such as CVD, PECVD, PVD, and sputter deposition.

In one embodiment, a metal stack containing two or more layers may be deposited as the first metal layer. For example, a metal stack may include an Al layer between one or more TiN or TiW layers. In another embodiment, a metal stack may include a Cu layer between one or more Ta or TaN layers.

The method 300 then proceeds to operation 304, where an IMO layer is deposited over the first metal layer. The IMO layer may include one or more oxide layers such as $SiO_2$, SiN, etc. The IMO layer is deposited on the first metal layer using deposition processes such as CVD, PECVD, and high density plasma CVD.

After depositing the IMO layer over the first metal layer, the deposited IMO layer is masked with a via pattern and vias are etched in the IMO layer in operation 306. More specifically, a photoresist layer is spin-coated and patterned over the IMO layer to form a photomask through exposure and development using conventional photolithography. The photomask serves to define etching locations or portions over the IMO layer. The IMO layer is then etched at least partially through until a portion of the first metal layer is exposed to form the vias.

In operation 308, a first barrier layer is deposited, preferably conformally, over the IMO layer and the vias. The First barrier layer is deposited so that it covers the interior walls defining the vias. The first barrier layer may be deposited by sputter deposition, CVD, or ionized metal plasma PVD. The barrier layer may include one or more barrier metal layers including TiN, Ta, TaN, TiW, TaSiN, and WN.

Then in operation 310, a second metal layer is deposited over the first barrier layer so that the second metal layer fills the vias. The second metal layer includes preferably Al or Cu, although other metals may also be utilized. For Cu layer, the preferred deposition method is electrochemical deposition. On the other hand, the preferred deposition method for Al is sputter deposition or CVD process. Although such deposition processes are used, it should be appreciated that the metal layer may be deposited using any suitable deposition processes such as CVD, PECVD, PVD, and sputter deposition processes.

Next in operation 312, the second metal layer above the top of the IMO layer is removed through CMP. The CMP process leaves the vias filled with the second metal layer. Then in operation 314, the IMO layer is photomasked with a trench pattern and is etched to form trenches. The trenches thus formed are preferably adjacent to a metal via.

In operation 316, a second barrier layer and a third metal layer are deposited over the trenches. The second barrier layer is preferably deposited over the trenches and the metal vias in a conformal manner. The deposition of the second barrier layer over the trenches forms encapsulated metal vias that are encased within the barrier layers. The third metal layer is deposited over the second barrier layer so as to fill the trenches.

Then in operation 318, the third metal layer above the trenches is removed by CMP. The CMP leaves the trenches filled with the metal of the third metal layer to serve as metal interconnects. If another metal layer is to be deposited, the method 300 proceeds back to operation 304 to form multi-level interconnects and vias. If not, the method proceeds to operation 322, where the processed semiconductor wafer stack undergoes well known passivation deposition, pad etch and alloy processes. Then in operation 324, the semiconductor wafer stack is packaged for creating an integrated circuit. The method then terminates in operation 326.

Advantageously, the encapsulated metal via effectively reduces voiding in the metal via by preventing the electromigration of electrons and atoms from the metal via to a metal line. The barrier layers that encapsulate metal via create stress gradients between the metal via and the metal line (e.g., metal trench) so that electromigration effect is significantly reduced for a small metal segment such as the metal via. In addition, the encapsulation allows higher current densities through the metal via than conventional metal vias. Accordingly, the encapsulation of the metal vias enhance the metal vias' reliability and prolong the semiconductor device lifetime.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A method for encapsulating a via over a first metal layer of a semiconductor substrate in a damascene processing to prevent voiding, the method comprising:

forming an intermetal oxide (IMO) layer over the first metal layer;

forming a via in the IMO layer such that the via exposes a portion of the first metal layer and a side wall of the via in the IMO layer;

conformally forming a first barrier layer over the IMO layer and the via such that a portion of the first barrier layer is deposited over the side wall of the IMO layer and the exposed portion of the first metal layer;

depositing a second metal layer over the first barrier layer such that the second metal layer fills the via within the first barrier layer portion deposited in the via to form a metal via;

removing the second metal layer and the first barrier layer above the metal via;

forming a trench in a portion of the IMO layer in contact with the first barrier layer to a specified depth; and forming a second barrier layer in the trench; and forming a third metal layer over the second barrier layer in the trench to form a metal trench such that the metal via is encapsulated by the first barrier layer so as to reduce electromigration effect in the metal via.

2. The method as recited in claim 1, wherein a portion of the second barrier layer forms an additional barrier layer between the metal via and the metal trench so as to further reduce electromigration effect in the metal via.

3. The method as recited in claim 1, wherein the IMO layer comprises an IMO layer stack including a plurality of oxide layers.

4. The method as recited in claim 1, wherein the IMO layer is made of an oxide material, the oxide material being selected from the group consisting essentially of $SiO_2$ and SiN.

5. The method as recited in claim 1, wherein the IMO layer forming includes:

depositing a first $SiO_2$ layer over the first metal layer;

depositing a SiN layer over the first $SiO_2$ layer; and depositing a second $SiO_2$ layer over the SiN layer.

6. The method as recited in claim 1, wherein the via forming further comprises:

photomasking the IMO layer with a via pattern; and etching the IMO layer to form the via.

7. The method as recited in claim 6, wherein the IMO layer photomasking comprises:

spin coating a photoresist material over the IMO layer;

exposing the coated photoresist material under a light source to the via pattern; and developing the coated photoresist material into the photoresist layer adapted to function as a via pattern photomask.

8. The method as recited in claim 1, wherein the first barrier layer is made of a barrier material, the barrier material being selected from the group consisting essentially of TiN, Ta, TaN, TiW, TaSiN, and WN.

9. The method as recited in claim 1, wherein the second metal layer is made of a metal, the metal being selected from the group consisting essentially of Al, Cu, and Si.

10. The method as recited in claim 1, wherein the second metal layer and the first barrier layer above the metal via are removed by a chemical mechanical polishing process.

11. The method as recited in claim 1, wherein the trench forming comprises:

photomasking the portion of the IMO layer in contact with the first barrier layer with a trench pattern; and etching the portion of the IMO layer in contact with the first barrier layer to the specified depth to form the trench for a metal line.

12. The method as recited in claim 11, wherein the IMO layer portion photomasking comprises:

spin coating a photoresist material over the IMO layer;

exposing the coated photoresist material under a light source to the trench pattern; and developing the coated photoresist material into the photoresist layer adapted to function as a trench pattern photomask.

13. The method as recited in claim 1, wherein the second barrier layer is made of a barrier material, the barrier material being selected from the group consisting essentially of TiN, Ta, TaN, TiW, TaSiN, and WN.

14. The method as recited in claim 1, wherein the third metal layer forming comprises:

depositing the third metal layer over the second barrier layer; and removing the third metal layer above the trench.

15. The method as recited in claim 14, wherein the third metal above the trench is removed by a chemical-mechanical polishing process.

16. A method for encapsulating a via over a first metal layer of a semiconductor substrate in a damascene processing to prevent voiding, the method comprising:

depositing an intermetal oxide (IMO) layer over the first metal layer;

forming a via in the IMO layer such that the via exposes a portion of the first metal layer and a side wall of the via in the IMO layer;

forming a first barrier layer in the via over the side wall of the IMO layer and the exposed portion of the first metal layer;

forming a metal via by depositing a second metal layer in the via to fill the via;

forming a trench of a specified depth in a portion of the IMO layer that is adjacent to the first barrier layer formed in the via; and conformally forming a second barrier layer in the trench; and forming a third metal layer over the second barrier layer in the trench to form a metal trench such that the metal via is encapsulated by the first barrier layer apart from the metal trench so as to reduce electromigration effect in the metal via.

17. The method as recited in claim 16, wherein a portion of the second barrier layer forms an additional barrier layer between the metal via and the metal trench so as to further reduce electromigration effect in the metal via.

18. The method as recited in claim 16, wherein the first barrier layer forming comprises conformally depositing the first barrier layer over the IMO layer and the via.

19. The method as recited in claim 18, wherein the metal via forming comprises:

depositing the second metal layer over the first barrier layer such that the second metal layer fills the via within the first barrier layer deposited in the via; and removing the second metal layer and the first barrier layer above a top portion of the IMO layer.

20. The method as recited in claim 19, wherein the first barrier layer above the metal via is removed.

21. The method as recited in claim 20, wherein the second metal layer and the first barrier layer above the metal via are removed by a chemical mechanical polishing.

22. The method as recited in claim 16, wherein the IMO layer comprises an IMO layer stack including a plurality of oxide layers.

23. The method as recited in claim 16, wherein the IMO layer is made of an oxide material, the oxide material being selected from the group consisting essentially of $SiO_2$ and SiN.

24. The method as recited in claim 16, wherein the IMO layer depositing further comprises:

depositing a first $SiO_2$ layer over the first metal layer;

depositing a SiN layer over the first $SiO_2$ layer; and depositing a second $SiO_2$ layer over the SiN layer.

25. The method as recited in claim 16, wherein the via forming further comprises:

photomasking the IMO layer with a via pattern; and etching the IMO layer to form the via.

26. The method as recited in claim 25, wherein the IMO layer photomasking comprises:

spin coating a photoresist material over the IMO layer;

exposing the coated photoresist material under a light source to the via pattern; and developing the coated photoresist material into the photoresist layer adapted to function as a via pattern photomask.

27. The method as recited in claim 16, wherein the first barrier layer is made of a barrier material, the barrier material being selected from the group consisting essentially of TiN, Ta, TaN, TiW, TaSiN, and WN.

28. The method as recited in claim 16, wherein the second metal layer is made of a metal, the metal being selected from the group consisting essentially of Al, Cu, and Si.

29. The method as recited in claim 16, wherein the trench forming comprises:

photomasking the portion of the IMO layer adjacent to the first barrier layer with a trench pattern; and etching the portion of the IMO layer adjacent to the first barrier layer to the specified depth to form the trench for a metal line.

30. The method as recited in claim 29, wherein the IMO layer portion photomasking comprises:

spin coating a photoresist material over the IMO layer;

exposing the coated photoresist material under a light source to the trench pattern; and developing the coated photoresist material into the photoresist layer adapted to function as a trench pattern photomask.

31. The method as recited in claim 16, wherein the second barrier layer is made of a barrier material, the barrier material being selected from the group consisting essentially of TiN, Ta, TaN, TiW, TaSiN, and WN.

32. The method as recited in claim 16, wherein the third metal layer forming further comprises:

depositing the third metal layer over the second barrier layer; and removing the third metal layer above the trench.

33. The method as recited in claim 32, wherein the third metal above the trench is removed by a chemical-mechanical polishing process.

34. A method for encapsulating a via formed in an oxide layer in a dual damascene processing to prevent voiding, the oxide layer being formed over a first metal layer of a semiconductor substrate, the via being defined by an exposed portion of the first metal layer and a side wall of the oxide layer, the method comprising:

forming a first barrier layer in the via over the side wall of the oxide layer and the exposed portion of the first metal layer;

forming a metal via by depositing a second metal layer in the via so as to fill the via;

forming a trench of a specified depth in a portion of the oxide layer that is adjacent to the first barrier layer formed in the via; and forming a second barrier layer in the trench; and forming a third metal layer over the second barrier layer in the trench to form a metal line such that the metal via is encapsulated by the first barrier layer apart from the metal line so as to reduce electromigration effect in the metal via.

35. The method as recited in claim 34, wherein the second barrier is conformally formed in the trench such that a portion of the second barrier layer forms an additional barrier layer between the metal via and the metal line so as to further reduce electromigration effect in the metal via.

36. The method as recited in claim 34, wherein the first barrier layer forming comprises conformally depositing the first barrier layer over the oxide layer and the via.

37. The method as recited in claim 36, wherein the metal via forming comprises:

depositing the second metal layer over the first barrier layer such that the second metal layer fills the via within the first barrier layer deposited in the via; and removing the second metal layer and the first barrier layer above the metal via.

38. The method as recited in claim 37, wherein the second metal layer and the first barrier layer above metal via are removed by a chemical mechanical polishing process.

39. The method as recited in claim 34, wherein the oxide layer is an intermetal oxide (IMO) layer.

40. The method as recited in claim 34, wherein the oxide layer comprises an IMO layer stack including a plurality of oxide layers.

41. The method as recited in claim 34, wherein the oxide layer is made of an oxide material, the oxide material being selected from the group consisting essentially of $SiO_2$ and SiN.

42. The method as recited in claim 34, wherein the oxide layer comprises a first $SiO_2$ layer, a SiN layer, and a second $SiO_2$ layer.

43. The method as recited in claim 34, wherein the first barrier layer is made of a barrier material, the barrier material being selected from the group consisting essentially of TiN, Ta, TaN, TiW, TaSiN, and WN.

44. The method as recited in claim 34, wherein the second metal layer is made of a metal, the metal being selected from the group consisting essentially of Al, Cu, and Si.

45. The method as recited in claim 34, wherein the second metal layer is an Al layer.

46. The method as recited in claim 34, wherein the second metal layer is a Cu layer.

47. The method as recited in claim 34, wherein the trench forming comprises:

photomasking the portion of the oxide layer adjacent to the first barrier layer with a trench pattern; and etching the portion of the oxide layer adjacent to the first barrier layer to the specified depth to form the trench for a metal line.

48. The method as recited in claim 47, wherein the oxide layer portion photomasking comprises:

spin coating a photoresist material over the oxide layer;

exposing the coated photoresist material through the trench pattern under a light source; and developing the coated photoresist material into the photoresist layer adapted to function as a trench pattern photomask.

49. The method as recited in claim 34, wherein the second barrier layer is made of a barrier material, the barrier material being selected from the group consisting essentially of TiN, Ta, TaN, TiW, TaSiN, and WN.

50. The method as recited in claim 35, wherein the third metal layer forming further comprises:

depositing the third metal layer over the second barrier layer; and removing the third metal layer above the trench.

51. The method as recited in claim 50, wherein the third metal above the trench is removed by a chemical-mechanical polishing process.

* * * * *